United States Patent
Mullen et al.

(10) Patent No.: US 6,870,246 B1
(45) Date of Patent: Mar. 22, 2005

(54) METHOD AND APPARATUS FOR PROVIDING AN INTEGRATED CIRCUIT COVER

(75) Inventors: Donald R. Mullen, Mountain View, CA (US); Belgacem Haba, Cupertino, CA (US); Ming Li, Fremont, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/944,545

(22) Filed: Aug. 31, 2001

(51) Int. Cl.[7] ............................................. H01L 23/02
(52) U.S. Cl. ................................. 257/678; 257/713
(58) Field of Search ............................ 257/678, 706, 257/712, 713, 717, 718, 719, 722; 361/719

(56) References Cited

U.S. PATENT DOCUMENTS

| | | | | |
|---|---|---|---|---|
| 5,783,461 A | * | 7/1998 | Hembree | 438/17 |
| 6,046,905 A | * | 4/2000 | Nelson et al. | 361/704 |
| 6,229,706 B1 | * | 5/2001 | Cook et al. | 361/719 |
| 6,349,032 B1 | * | 2/2002 | Chan et al. | 361/704 |
| 6,472,742 B1 | * | 10/2002 | Bhatia et al. | 257/713 |
| 6,586,684 B2 | * | 7/2003 | Frutschy et al. | 174/260 |
| 2002/0079571 A1 | * | 6/2002 | Takeuchi et al. | 257/706 |

* cited by examiner

*Primary Examiner*—Eddie Lee
*Assistant Examiner*—Douglas W. Owens
(74) *Attorney, Agent, or Firm*—Hunton & Williams LLP

(57) ABSTRACT

An integrated circuit cover incorporating a spring portion is described. The spring portion may include any structure that allows displacement between a plate portion of the integrated circuit cover and an attachment portion of the integrated circuit cover and that provides a substantially equalizing effect of pressure on the plate portion. The spring portion is preferably more flexible than the plate portion. The integrated circuit cover accommodates variations in the mounted height of integrated circuits over which the integrated circuit cover is installed The integrated circuit cover may be formed as a unitary structure or may be constructed as an assembly of multiple components.

44 Claims, 13 Drawing Sheets

METHOD AND APPARATUS FOR PROVIDING AN INTEGRATED CIRCUIT COVER

TECHNICAL FIELD OF THE INVENTION

The invention relates generally to integrated circuit packaging and, more specifically, to an integrated circuit cover.

BACKGROUND OF THE INVENTION

As electronic systems have increased in complexity, attempts have been made to increase the amount of electronic circuitry contained in a given amount of space. One existing approach is to mount integrated circuits on a circuit board and cover them with an cover. The cover provides physical protection for the integrated circuits and serves as a heat spreader to help dissipate heat from the integrated circuits. An existing integrated circuit cover does not accommodate height variations of mounted integrated circuits. Consequently, a variety of integrated circuit covers, each corresponding to a different integrated circuit height must be available, with the appropriate integrated circuit cover selected and installed over the integrated circuits after the mounted integrated circuit has been determined. This variety of integrated circuit covers results in complicated production and inventory issues.

FIG. 1 is a cross-sectional view diagram illustrating an example of an assembly incorporating an existing integrated circuit cover. The assembly includes a circuit board 101. Circuit board 101 has a first surface 114 and a second surface 115. Integrated circuit 106 is mounted on first surface 114 of circuit board 101 via connections 107. Integrated circuit 108 is mounted on first surface 114 of circuit board 101 via connections 109. Integrated circuit 110 is mounted on first surface 114 of circuit board 101 via connections 111. Integrated circuit 112 is mounted on first surface 114 of circuit board 101 via connections 113.

Integrated circuit cover 102 covers integrated circuits 106, 108, 110, and 112, and is attached to circuit board 101 via fasteners 104 and 105. Thermally conductive material 103 fills gaps between integrated circuits 106, 108, 110, and 112 and integrated circuit cover 102. A certain amount of pressure of integrated circuit cover 102 against thermally conductive material 103 is desirable to ensure good contact with integrated circuits 106, 108, 110, and 112 so as to promote heat transfer from integrated circuits 106, 108, 110, and 112 to integrated circuit cover 102. However, the geometry of the assembly results in pressure being localized near fasteners 104 and 105. Since some integrated circuits are closer to fasteners 104 and 105 than other integrated circuits, the pressure exerted against integrated circuits 106, 108, 110, and 112 is unequal. The inequality of pressure can affect heat transfer and limits the amount of pressure that may be applied without causing excessive pressure to be placed on integrated circuits near fasteners 104 and 105. As can be seen from FIG. 1, integrated circuit cover 102 tends to bow outward. Depending on the rigidity of circuit board 101, circuit board 101 may tend to bow outward, away from the cover, resulting in surface 115 of circuit board 101 being displaced to position 116. Thus, even when an integrated circuit cover of a particular height is selected, dimensional distortion of the integrated circuit cover can result in uneven thermal conductivity and reduced performance.

Therefore, a integrated circuit cover is needed that avoids the need to produce and maintain in inventory covers of different heights. An integrated circuit cover is needed that provides even thermal performance over a large area, for example, over multiple integrated circuits.

DETAILED DESCRIPTION OF A PREFERRED EMBODIMENT

Figure 1:
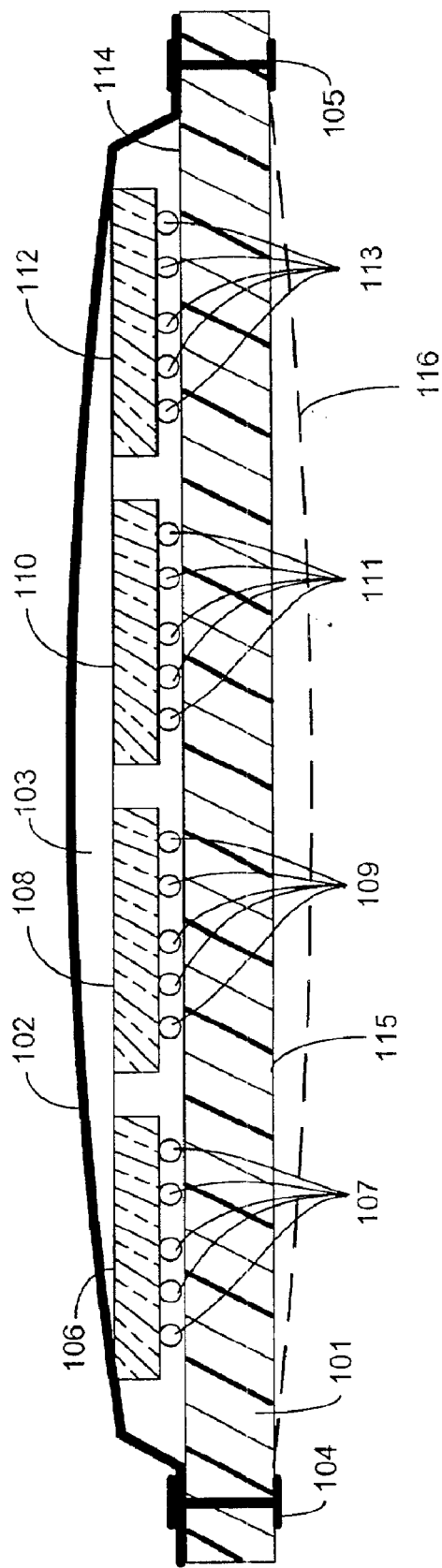
FIG. 1 is a cross-sectional view diagram illustrating an example of an assembly incorporating a prior art integrated circuit cover.

An integrated circuit cover incorporating a spring portion is described. The spring portion may include any structure that allows displacement between a plate portion of the integrated circuit cover and an attachment portion of the integrated circuit cover and that provides a substantially equalizing effect of pressure on the plate portion. The spring portion is preferably more flexible than the plate portion. The integrated circuit cover accommodates variations in the mounted height of integrated circuits over which the integrated circuit cover is installed. The integrated circuit cover may be formed as a unitary structure or may be constructed as an assembly of multiple components.

An integrated circuit cover according to an embodiment of the invention allows reduced mechanical stress, increased and more even thermal conductivity, simplified production and inventory, simplified installation, and reduced cost, among other benefits. Other embodiments may be practiced to provide various combinations of one or more of the benefits.

The integrated circuit cover may be constructed of polymer materials exhibiting a thermal conductivity of at least approximately 10 wattsmeter Kelvin (w/mK). An example of a suitable polymer material is the COOLPOLY E2 thermally conductive liquid crystalline polymer (LCP) available from COOL POLYMERS, Inc., 333 Strawberry Field Rd., Warwick, R.I. 02886. Polymer materials such as those described above or other polymer materials or elastomer materials may be used in combination with one or more metallic materials, such as metals or metal alloys. In other embodiments, the integrated circuit cover is constructed entirely of one or more metallic materials, such as metals or metal alloys.

Alternatively, the invention may be practiced in embodiments where thermal conductivity is an secondary consideration. For example, an integrated circuit cover in accordance with an embodiment of the invention may be used such that protection of the integrated circuits is the primary benefit. As an example of such protection, the integrated circuit cover may maintain integrated circuits, such as bump-mounted integrated circuits, in contact with a circuit board and/or protect the integrated circuits from external forces, objects, or events. In such embodiments, materials exhibiting lower thermal conductivity than 10 w/mK may be used.

An integrated circuit cover in accordance with an embodiment of the invention may be used in conjunction with any types of integrated circuits. Examples of such integrated circuits include memory devices, microprocessors, and microcontrollers, although any other types of integrated circuits, including combinations of different types of integrated circuits, may be used. An integrated circuit cover may cover one or more integrated circuits, thereby forming a module. Examples of such modules include memory modules, microprocessor (including multiprocessor) modules, microcontroller modules, and systems including memory, processing, and support circuits. An example of a situation in the integrated circuit cover may be beneficially used is where several integrated circuits function together at high data rates, for example, in the types of modules described above. The integrated circuit cover affords the opportunity to place several integrated circuits in close proximity, yet to provide sufficient power dissipation.

Figure 2:
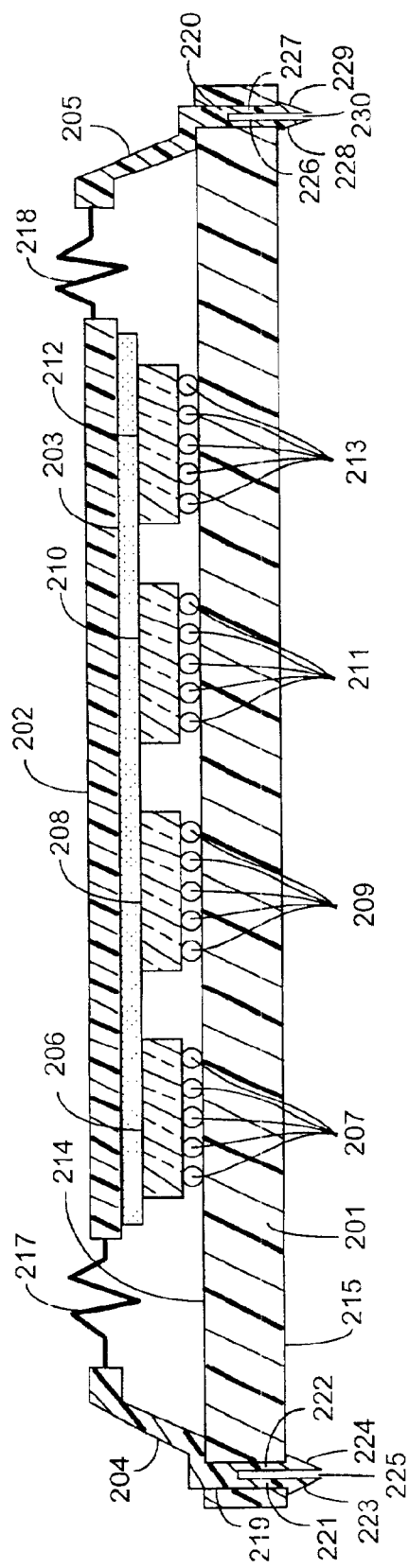
FIG. 2 is a cross-sectional view diagram illustrating an assembly comprising an integrated circuit cover in accordance with an embodiment of the present invention.

FIG. 2 is a cross-sectional view diagram illustrating an assembly comprising an integrated circuit cover in accordance with an embodiment of the present invention. The assembly includes a circuit board 201. Circuit board 201 has a first surface 214 and a second surface 215. Integrated circuit 206 is mounted on the first surface 214 of circuit board 201 via connections 207. Integrated circuit 208 is mounted on first surface 214 of circuit board 201 via connections 209. Integrated circuit 210 is mounted on first surface 214 of circuit board 201 via connections 211. Integrated circuit 212 is mounted on first surface 214 of circuit board 201 via connections 213.

An integrated circuit cover covers integrated circuits 206, 208, 210, and 212. The integrated circuit cover includes a plate portion 202, an attachment portion 204, an attachment portion 205, a spring portion 217, and a spring portion 218. Spring portion 217 couples attachment portion 204 to plate portion 202. Spring portion 218 couples attachment portion 205 to plate portion 202. Spring portions 217 and 218 cause plate portion 202 to exert pressure on thermal interface 203, which applies the pressure to integrated circuits 206, 208, 210, and 212. Such pressure is beneficial for establishing a good thermal connection between the integrated circuits 206, 208, 210, and 212 and plate portion 202. Before the integrated circuit cover is attached to the circuit board 201, the spring portions 217 and 218 may be in a relaxed state. However, when the integrated circuit cover is attached to the circuit board 201, the spring portions 217 and 218 are preferably maintained in a non-relaxed state.

Attachment portion 204 includes a retainer 219. Retainer 219 comprises a first retainer portion 221 and a second retainer portion 222. First retainer portion 221 terminates in first barb 223. Second retainer portion 222 terminates in second barb 224. First retainer portion 221 and second retainer portion 222 define a channel 225 separating first retainer portion 221 from second retainer portion 222.

Attachment portion 205 includes retainer 220. Retainer 220 comprises a first retainer portion 226 and a second retainer portion 227. First retainer portion 226 terminates in first barb 228. Second retainer portion 227 terminates in second barb 229. First retainer portion 226 and second retainer portion 227 define a channel 230 that separates first retainer portion 226 from second retainer portion 227.

Thermal interface 203 is disposed between plate portion 202 and integrated circuits 206, 208, 210, and 212. Two examples of suitable materials for thermal interface 203 include silicone and a phase change material (PCM) or the like. In other embodiments, thermal interface 203 may be omitted, and plate portion 202 may or may not be maintained in contact with integrated circuits 206, 208, 210, and 212.

Figure 3:
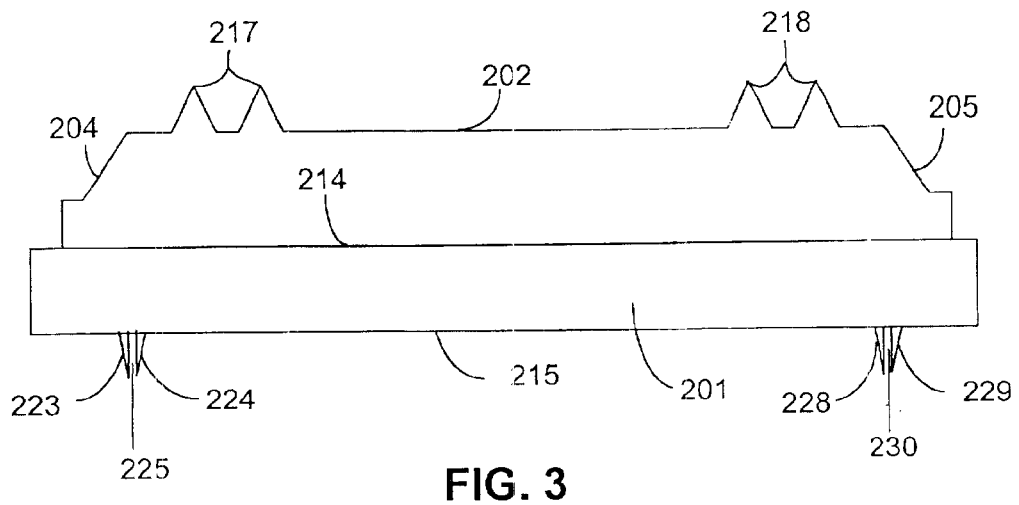
FIG. 3 is a side elevation view diagram illustrating an assembly comprising an integrated circuit cover in accordance with the example illustrated in FIG. 2.

FIG. 3 is a side elevation view diagram illustrating an assembly comprising an integrated circuit cover in accordance with the example illustrated in FIG. 2. The integrated circuit cover comprises a plate portion 202, an attachment portion 204, an attachment portion 205, a spring portion 217, and a spring portion 218. An integrated circuit attaches to a first surface 214 of a circuit board 201. A retainer of the integrated circuit cover extends through circuit board 201. The retainer includes a first barb 223 and a second barb 224 which engage a second surface 215 of circuit board 201. The first barb 223 and the second barb 224 define a channel 225 between them. The channel 225 allows flexure of the retainer and displacement of the first barb 223 and the second barb 224 so that the first barb 223 and the second barb 224 can pass through a hole in circuit board 201.

Another retainer of the integrated circuit cover extends through circuit board 201. The retainer includes a first barb 228 and a s second barb 229 which engage a second surface 215 of circuit board 201. The first barb 228 and the second barb 229 define a channel 230 between them. The channel 230 allows flexure of the retainer and displacement of the first barb 228 and the second barb 229 so that the first barb 228 and the second barb 229 can pass through a hold in circuit board 201.

Figure 4:
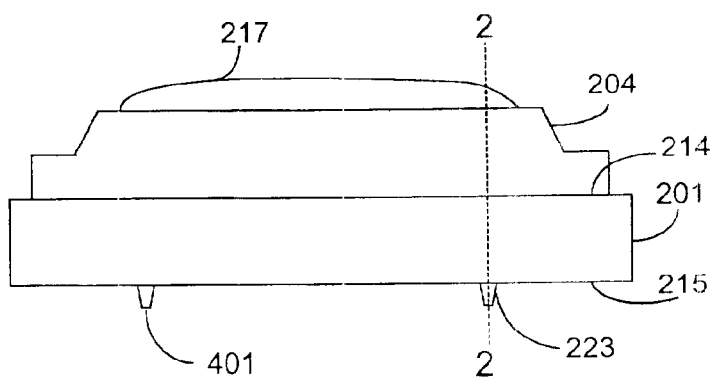
FIG. 4 is an end elevation view diagram illustrating an assembly comprising an integrated circuit cover in accordance with the example illustrated in FIG. 2.

FIG. 4 is an end elevation view diagram illustrating an assembly comprising an integrated circuit cover in accordance with the example illustrated in FIG. 2. The integrated circuit cover comprises an attachment portion 204 and a spring portion 217. An integrated circuit attaches to a first surface 214 of circuit board 201. Retainers of the integrated circuit cover extend through circuit board 201. One retainer includes a first barb 223 which engages a second surface 215 of circuit board 201. Another retainer includes a first barb 401 which engages the second surface 215 of circuit board 201.

Figure 5:
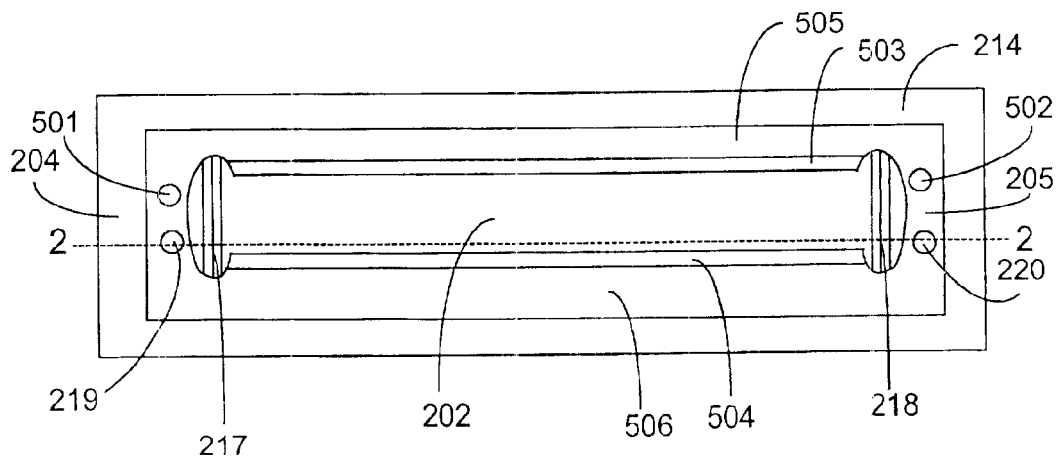
FIG. 5 is a top plan view diagram illustrating an assembly comprising an integrated circuit cover in accordance with the example illustrated in FIG. 2.

FIG. 5 is a top plan view diagram illustrating an assembly comprising an integrated circuit cover in accordance with the example illustrated in FIG. 2. The integrated circuit cover comprises a plate portion 202, a spring portion 217, a spring portion 218, an attachment portion 204, and an attachment portion 205. The integrated circuit cover attaches to a first surface 214 of a circuit board. Attachment portion 204 includes retainers 219 and 501. Attachment portion 205 includes retainers 220 and 502. Retainers 219, 220, 501, and 502 secure the integrated circuit cover to the circuit board. The integrated circuit cover preferably includes a flange 505 and a flange 506. Flanges 505 and 506 preferably meet with the first surface 204 of the circuit board to fully enclose integrated circuits mounted on the circuit board. Flanges 505 and 506 are coupled to plate portion 202 via flexible portions 503 and 504, respectively. Flexible portions 503 and 504 may be of a similar structure as spring portions 217 and 218, for example, effectively forming a continuous spring portion that surrounds plate portion 202. Alternatively, flexible portions 503 and 504 may be of an alternative structure, provided they allow displacement of plate portion 202. As another alternative, flexible portions 503 and 504 may be omitted.

Figure 6:
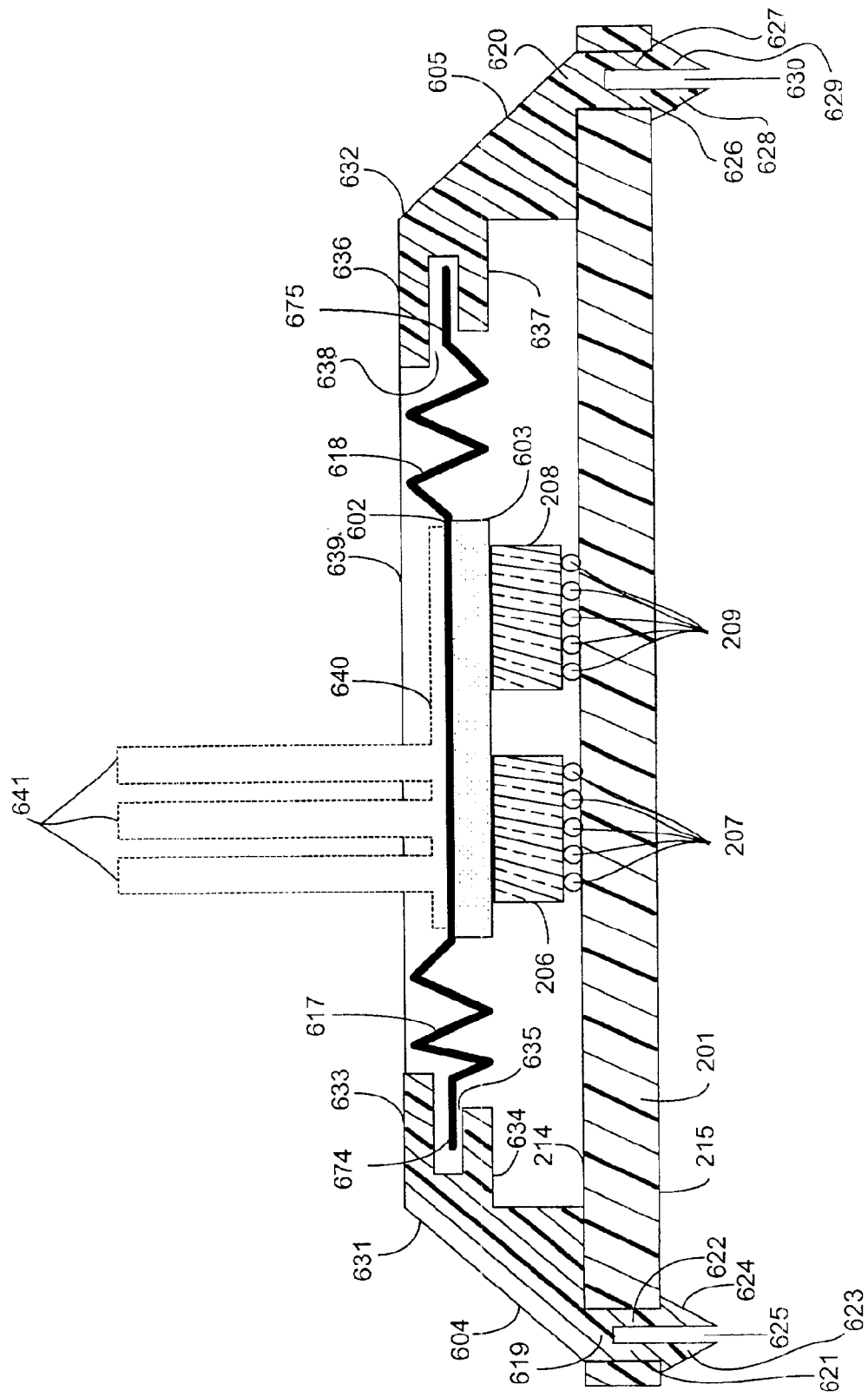
FIG. 6 is a cross sectional view diagram illustrating an assembly comprising an integrated circuit cover in accordance with an embodiment of the invention.

FIG. 6 is a cross sectional view diagram illustrating an assembly comprising an integrated circuit cover in accordance with an embodiment of the invention. The integrated circuit cover comprises a plate portion 602, a spring portion 617, a spring portion 618, an attachment portion 604, and an attachment portion 605. The plate portion 602, the spring portion 617, and the spring portion 618 are formed as a unitary structure, and serve as a heat spreader, while attachment portion 604 and the attachment portion 605 are formed separately from that unitary structure. Attachment portions 604 and 605 engage a first surface 214 of circuit board 201.

The attachment portion 604 includes a retainer 619 to maintain attachment to circuit board 201. The retainer 619 comprises retainer portions 621 and 622. Retainer portion 621 includes barb 623. Retainer portion 622 includes barb 624. Barbs 623 and 624 engage a second surface 215 of circuit board 201. Retainer portions 621 and 622 are separated from each other so as to define a channel 625.

The attachment portion 605 includes a retainer 620 to maintain attachment to circuit board 201. The retainer 620 comprises retainer portions 626 and 627. Retainer portion 626 includes barb 628. Retainer portion 627 includes barb 629. Barbs 628 and 629 engage the second surface 215 of circuit board 201. Retainer portions 626 and 627 are separated from each other so as to define a channel 630. As is apparent to one of ordinary skill in the art, other attachment schemes can be used to couple the integrated circuit cover to circuit board 201. For example, separate fasteners not integrated with the cover, such as screws, rivets, and the like, can be used to physically couple the integrated circuit cover to the circuit board 201.

The attachment portion 604 includes a coupling portion 631 to couple attachment portion 604 to the heat spreader. The coupling portion 631 includes extensions 633 and 634 that define a channel 635 to accept the heat spreader. The attachment portion 605 includes a coupling portion 632 to couple attachment portion 605 to the heat spreader. The coupling portion 632 includes extensions 636 and 637 that define a channel 638 to accept the heat spreader. The heat spreader includes an extension 674 coupled to spring portion 617. Channel 635 accepts extension 674 so as to attach the heat spreader to attachment portion 604. The heat spreader includes an extension 675 coupled to spring portion 618. Channel 638 accepts extension 675 so as to attach the heat spreader to attachment portion 605.

Integrated circuit 206 is attached to first surface 214 of circuit board 201 via connections 207. Integrated circuit 208 is attached to first surface 214 of circuit board 201 via connections 209. A thermally conductive material 603 thermally couples integrated circuits 206 and 208 to plate portion 602 of the heat spreader. To enhance the thermal characteristics of the heat spreader, a heat sink 640 having fins 641 may be attached to the surface of plate portion 602 opposite the surface to which thermally conductive material 603 is attached. Optionally, a protective cover 639 may be provided over the heat spreader. For example, the protective cover 639 may be integrally formed with attachment portion 604 and attachment portion 605.

Figure 7:
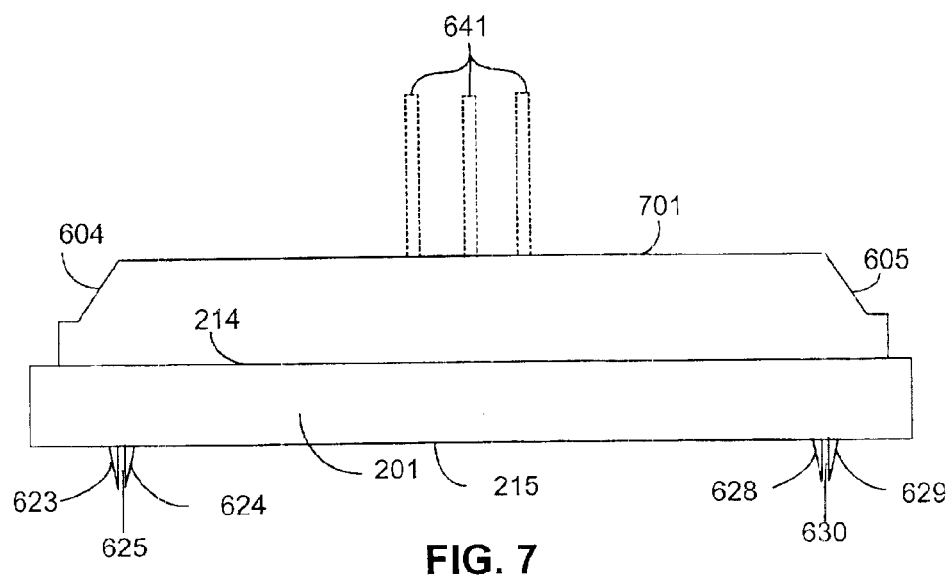
FIG. 7 is a side elevation view diagram illustrating an assembly comprising an integrated circuit cover in accordance with the example illustrated in FIG. 6.

FIG. 7 is a side elevation view diagram illustrating an assembly comprising an integrated circuit cover in accordance with the example illustrated in FIG. 6. The assembly comprises a circuit board 201 having a first surface 214 and a second surface 215 and an integrated circuit cover 701. The integrated circuit cover 701 includes attachment portion 604, attachment portion 605, and, optionally, extended surface 641. Extended surface 641 may include fins, pins, or other physical structures intended to increase the surface area or heat transfer characteristics such that heat dissipation is improved. Attachment portion 604 includes a retainer comprising first barb 623 and second barb 624. The first barb 623 and the second barb 624 are separated so as to define a channel 625. Attachment portion 605 includes a retainer comprising first barb 628 and second barb 629. The first barb 628 and the second barb 629 are separated so as to define a channel 630. Alternatively, the retainers need not include separated barbs; if the retainers exhibit sufficient elasticity to pass through holes in circuit board 201, the first and second barbs may be formed as a unitary annular barb.

Figure 8:
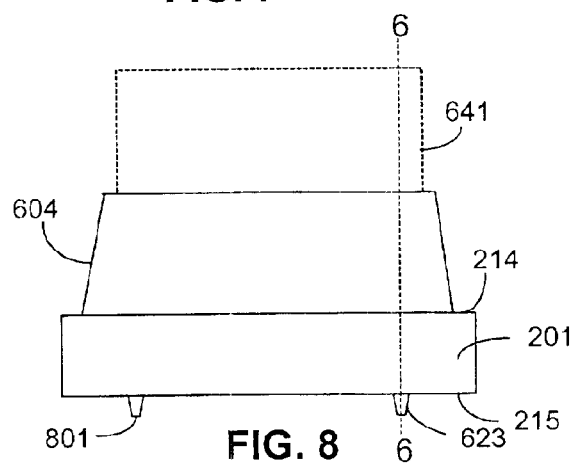
FIG. 8 is an end elevation view diagram illustrating an assembly comprising an integrated circuit cover in accordance with the example illustrated in FIG. 6.

FIG. 8 is an end elevation view diagram illustrating an assembly comprising an integrated circuit cover in accordance with the example illustrated in FIG. 6. The assembly comprises a circuit board 201 having a first surface 214 and a second surface 215 and an integrated circuit cover having an attachment portion 604 and, optionally, fins 641. The attachment portion 604 includes retainers having barbs 623 and 801. Barbs 623 and 801 engage the second surface 215 of circuit board 201 to attach the integrated circuit cover to the circuit board 201.

Figure 9:
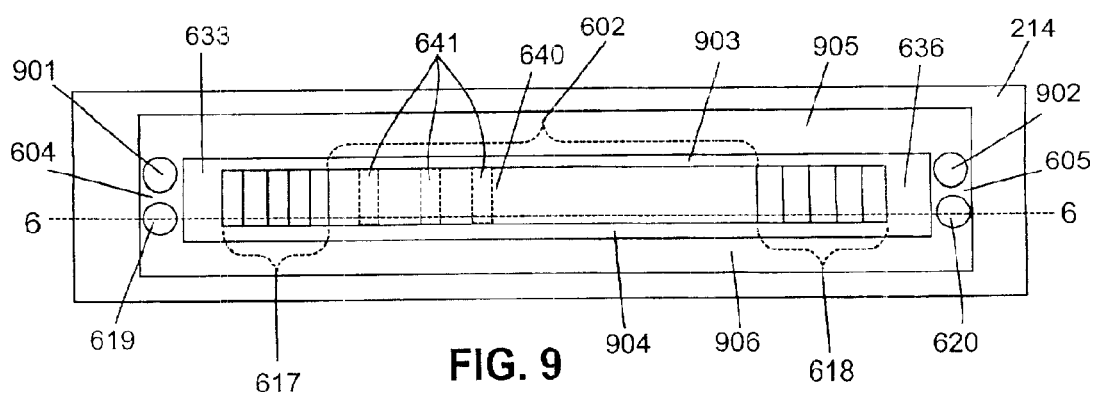
FIG. 9 is a top plan view diagram illustrating an assembly comprising an integrated circuit cover in accordance with the example illustrated in FIG. 6.

FIG. 9 is a top plan view diagram illustrating an assembly comprising an integrated circuit cover in accordance with the example illustrated in FIG. 6. The assembly comprises the integrated circuit cover and a circuit board having a first surface 214. The integrated circuit cover includes a heat spreader comprising a plate portion 602 and spring portions 617 and 618. The heat spreader may optionally include a heat sink 640 comprising fins 641. The integrated circuit cover further includes a attachment element including attachment portion 604 and attachment portion 605. Attachment portion 604 includes retainers 619 and 901. Attachment portion 605 includes retainers 620 and 902. Attachment portion 604 includes extension 633 that extends to engage the beat spreader. Attachment portion 605 includes extension 636 that extends to engage the heat spreader. Optionally, flange 905 extends from attachment portion 604 to attachment portion 605 along one side of the heat spreader and flange 906 extends from attachment portion 604 to attachment portion 605 along an opposite side of the heat spreader. Flange 905 includes extension 903 to engage the heat spreader. Flange 906 includes extension 904 to engage the heat spreader.

Figure 10:
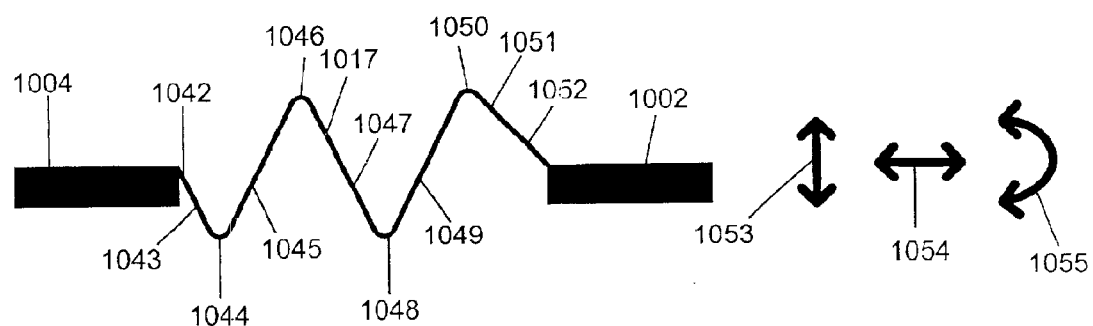
FIG. 10 is a cross sectional view diagram illustrating an example of a spring portion of an integrated circuit cover in accordance with an embodiment of the invention.

FIG. 10 is a cross sectional view diagram illustrating an example of a spring portion of an integrated circuit cover in accordance with an embodiment of the invention. The spring portion includes a segment 1043 extending from a spring terminus 1042 to an apex 1044, a segment 1045 extending from apex 1044 to apex 1046, a segment 1047 extending from apex 1046 to apex 1048, a segment 1049 extending from apex 1048 to apex 1050, and a segment 1051 extending from apex 1050 to spring terminus 1052. Spring terminus 1042 is coupled to element 1004, which may, for example, be an attachment portion of the integrated circuit cover. Spring terminus 1052 is coupled to element 1002, which may, for example, be a plate portion of the integrated circuit cover. The spring portion illustrated in FIG. 10 has a cross section comprising a zig-zag-shaped portion. The alternately oriented segments and apexes provide the zig-zag shape. The segments can be of varying length and no uniformity is required in order to achieve the desired result. The spring portion may be practiced with different numbers of segments and apexes. The spring portion provides for translation of element 1002 relative to element 1004 in direction 1053 and/or direction 1054, as well as rotation of element 1002 relative to element 1004 in direction 1055. The spring portion is preferably thinner than element 1004 and element 1002. In other embodiments, the spring portion is made of a different material than elements 1004 and 1002, in which case the thickness of the spring portion is based on the qualities of the materials of which it is comprises, independent of the thickness of the elements 1004 and 1002.

Figure 11:
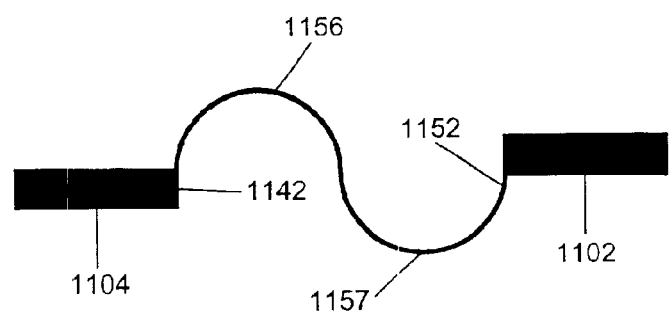
FIG. 11 is a cross sectional view diagram illustrating an example of a spring portion of an integrated circuit cover in accordance with an embodiment of the invention.

FIG. 11 is a cross sectional view diagram illustrating an example of a spring portion of an integrated circuit cover in accordance with an embodiment of the invention. The spring portion includes an arcuate portion 1156 coupled to an arcuate portion 1157. The arcuate portion 1156 and the arcuate portion 1157 collectively form an S-shaped portion. The S-shaped portion extends from spring terminus 1142 to spring terminus 1152. The spring portion is coupled to element 1104 at spring terminus 1142. Element 1104 may, for example, be an attachment portion of the integrated circuit cover. The spring portion is coupled to element 1102 at spring terminus 1152. Element 1102 may, for example, be a plate portion of the integrated circuit cover. The spring portion of FIG. 11 has a cross section comprising the S-shaped portion. The spring portion may be practiced with a different number of arcuate portions. These arcuate portions may be of varying size and radius. The spring portion provides for translation and rotation of element 1102 relative to element 1104. The spring portion is preferably thinner than element 1104 and element 1102. In other embodiments, the spring portion is made of a different material than elements 1104 and 1102, in which case the thickness of the spring portion is based on the qualities of the materials of which it is comprises, independent of the thickness of the elements 1104 and 1102.

Figure 12:
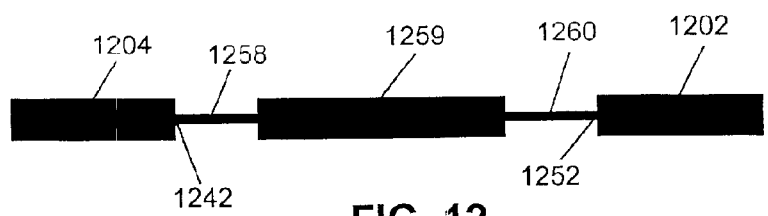
FIG. 12 is a cross sectional view diagram illustrating an example of a spring portion on an integrated circuit cover in accordance with an embodiment of the invention.

FIG. 12 is a cross sectional view diagram illustrating an example of a spring portion on an integrated circuit cover in accordance with an embodiment of the invention. The spring portion of FIG. 12 has a cross section comprising a molded living hinge portion. The molded living hinge portion is coupled to element 1204 at spring terminus 1242 and to element 1202 at spring terminus 1252. Element 1204 may, for example, be an attachment portion of the integrated circuit cover. Element 1202 may, for example, be a plate portion of the integrated circuit cover. The molded living hinge portion comprises a living hinge portion 1258 of a thinner cross section than element 1204 and a living hinge portion 1260 of a thinner cross section than element 1202. The living hinge portion 1258 is coupled to element 1204 at spring terminus 1242. The living hinge portion 1260 is coupled to element 1202 at spring terminus 1252. The living hinge portion 1258 is coupled to the living hinge portion 1260 by coupling portion 1259, which has a thicker cross section than living hinge portions 1258 and 1260.

Figure 13:
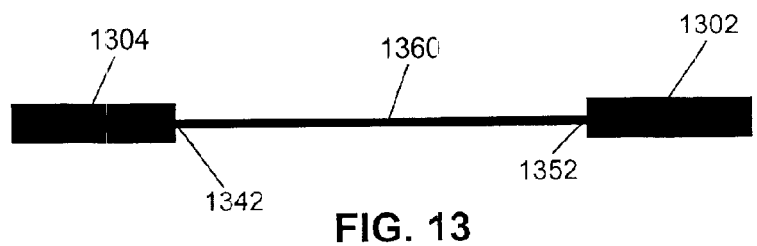
FIG. 13 is a cross sectional view diagram illustrating an example of a spring portion of an integrated circuit cover in accordance with an embodiment of the invention.

FIG. 13 is a cross sectional view diagram illustrating an example of a spring portion of an integrated circuit cover in accordance with an embodiment of the invention. The spring portion of FIG. 13 has a cross section comprising a molded cantilever hinge portion. Molded cantilever hinge portion 1360 is coupled to element 1304 at spring terminus 1342 and to element 1302 at spring terminus 1352. Element 1304 may, for example, be an attachment portion of the integrated circuit cover. Element 1302 may, for example, be a plate portion of the integrated circuit cover. Molded cantilever hinge portion 1360 has a thinner cross section than element 1304 and element 1302.

Figure 14:
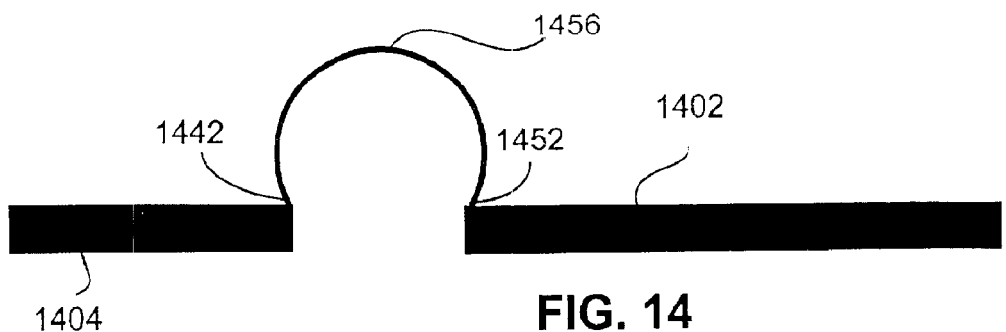
FIG. 14 is a cross sectional view diagram illustrating an example of a spring portion of an integrated circuit cover in accordance with an embodiment of the invention.

FIG. 14 is a cross sectional view diagram illustrating an example of a spring portion of an integrated circuit cover in accordance with an embodiment of the invention. The spring portion of FIG. 14 has a cross section comprising an arcuate portion. Arcuate portion 1456 extends from spring terminus 1442 to spring terminus 1452. Arcuate portion 1456 is coupled to element 1404 at spring terminus 1442. Arcuate portion 1456 is coupled to element 1402 at spring terminus 1452. Element 1404 may, for example, be an attachment portion of the integrated circuit cover. Element 1402 may, for example, be a plate portion of the integrated circuit cover.

As can be seen from FIG. 14, many variations of the embodiment illustrated in FIG. 11 are possible. While the embodiment of FIG. 11 includes two arcuate portions having different directions of curvature, the embodiment of FIG. 14 includes an arcuate portion having a single arc. It can be readily understood that the invention may be practiced in various embodiments having various numbers of arcs, including arcs of similar or different directions. Likewise, arcuate portions may be combined with portions of other geometries, for example, V-shaped, straight, and/or other regular or irregular geometries.

Figure 15:
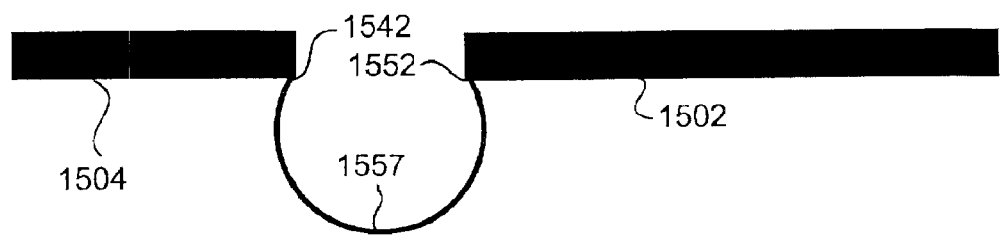
FIG. 15 is a cross sectional view diagram illustrating an example of a spring portion of an integrated circuit cover in accordance with an embodiment of the invention.

FIG. 15 is a cross sectional view diagram illustrating an example of a spring portion of an integrated circuit cover in accordance with an embodiment of the invention. While the spring portion of FIG. 14 includes an arcuate portion having a convex surface oriented in one direction, the spring portion of FIG. 15 includes an arcuate portion having a concave surface when the integrated circuit cover is oriented in the same direction. Arcuate portion 1557 extends from spring terminus 1542 to spring terminus 1552. Arcuate portion 1557 is coupled to element 1504 at spring terminus 1542. Arcuate portion 1557 is coupled to element 1502 at spring terminus 1552. Element 1504 may, for example, be an attachment portion of the integrated circuit cover. Element 1502 may, for example, be a plate portion of the integrated circuit cover.

Figure 16:
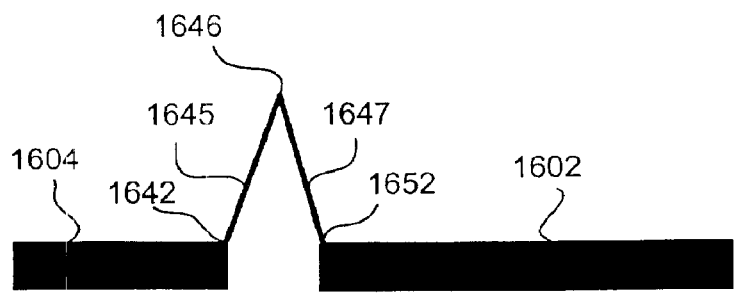
FIG. 16 is a cross sectional view diagram illustrating an example of a spring portion of an integrated circuit cover in accordance with an embodiment of the invention.

FIG. 16 is a cross sectional view diagram illustrating an example of a spring portion of an integrated circuit cover in accordance with an embodiment of the invention. The spring portion of FIG. 16 has a cross section comprising a V-shaped portion. The V-shaped portion comprises segment 1645 extending from spring terminus 1642 to apex 1646 and segment 1647 extending from apex 1646 to spring terminus 1652. The spring portion is coupled to element 1604 at spring terminus 1642 and to element 1602 at spring terminus 1652. Element 1604 may, for example, be an attachment portion of the integrated circuit cover. Element 1602 may, for example, be an plate portion of the integrated circuit cover.

As can be seen from FIG. 16, many variations of the embodiment illustrated in FIG. 10 are possible. While the embodiment of FIG. 10 includes spring portion having a "zig-zag" shape that includes multiple individual V-shaped portions combined together, the embodiment of FIG. 16 includes a single V-shaped portion. It can be readily understood that the invention may be practiced in various embodiments having various numbers of V-shaped portions, including V-shaped portions of similar or different directions. Likewise, V-shaped portions may be combined with portions of other geometries, for example, arcuate, straight, and/or other regular or irregular geometries.

Figure 17:
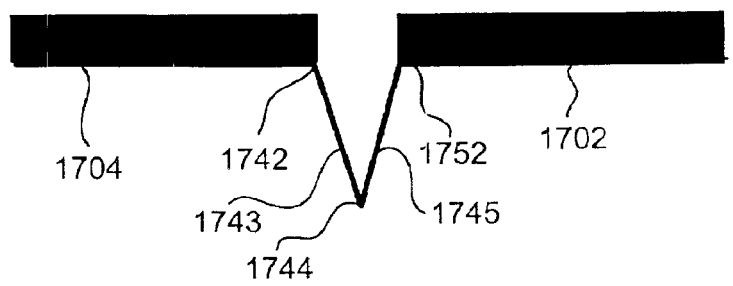
FIG. 17 is a cross sectional view diagram illustrating an example of a spring portion of an integrated circuit cover in accordance with an embodiment of the invention.

FIG. 17 is a cross sectional view diagram illustrating an example of a spring portion of an integrated circuit cover in accordance with an embodiment of the invention. While the spring portion of FIG. 16 includes a V-shaped portion extending upward relative to one orientation of the integrated circuit cover, the spring portion of FIG. 17 has a cross section comprising a V-shaped portion extending downward relative to the same orientation of the integrated circuit cover. The V-shaped portion comprises segment 1743 extending from spring terminus 1742 to apex 1744 and segment 1745 extending from apex 1744 to spring terminus 1752. The spring portion is coupled to element 1704 at spring terminus 1742 and to element 1702 at spring terminus 1752. Element 1704 may, for example, be an attachment portion of the integrated circuit cover. Element 1702 may, for example, be an plate portion of the integrated circuit cover.

Figure 18:
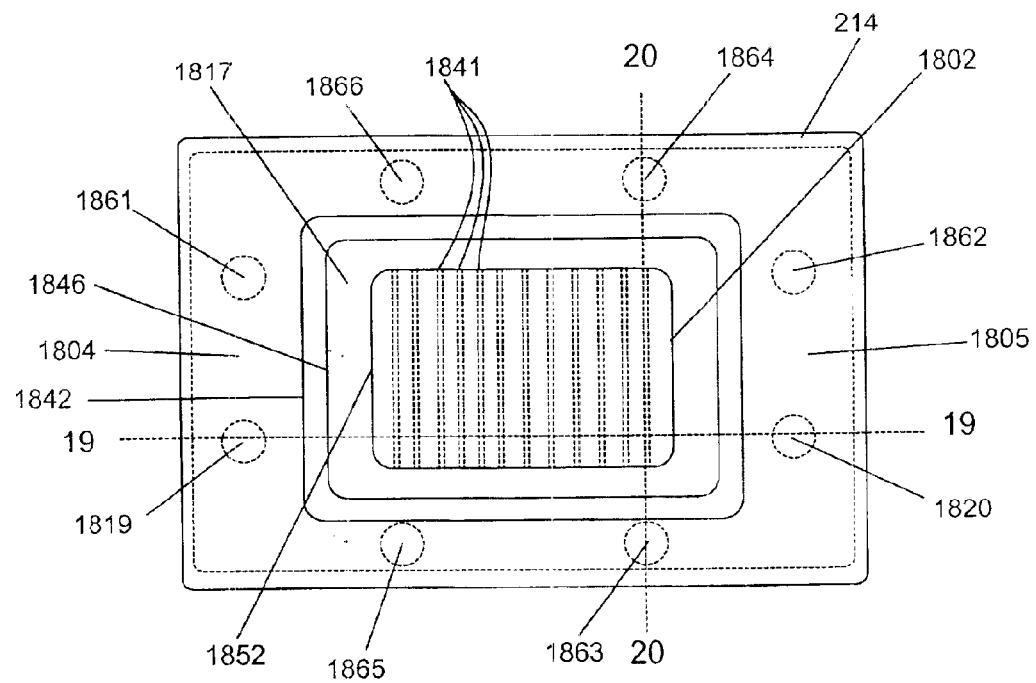
FIG. 18 is a top plan view diagram illustrating an assembly comprising an integrated circuit cover in accordance with an embodiment of the invention.

FIG. 18 is a top plan view diagram illustrating an assembly comprising an integrated circuit cover in accordance with an embodiment of the invention. The assembly comprises a circuit board having a first surface 214 and the integrated circuit cover. The integrated circuit cover comprises a plate portion 1802, a spring portion 1817, an attachment portion 1804, and an attachment portion 1805. The plate portion 1802 may optionally include fins 1841 to improve its thermal characteristics. Spring portion 1817 includes spring terminus 1852 at an interface between plate portion 1802 and spring portion 1817, apex 1846, and spring terminus 1842 at an interface between attachment portion 1804 and spring portion 1817. As an example, spring portion 1817 may be implemented as a diaphragm spring structure. Such a structure can be formed by providing a flexible region between attachment portions 1804 and 1805 and plate portion 1802. The flexible region may, for example, have a corrugated construction to provide flexibility. Alternatively, other forms of construction (examples of which are described herein) may be used to provide flexibility. The flexible region may, for example, extend around the perimeter of plate portion 1802, forming a closed path around plate portion 1802. Alternatively, the flexible region may be formed from one or more segments that need not form a closed path around plate portion 1802. As an example, a plurality of individual spring elements or spring-like structures may be substituted for the flexible region.

Attachment portion 1804 comprises retainers 1819 and 1861 that couple the integrated circuit cover to the circuit board. Attachment portion 1805 comprises retainers 1820 and 1862 that couple the integrated circuit cover to the circuit board. The integrated circuit cover optionally includes retainers 1863, 1864, 1865, and 1866 that couple the integrated circuit cover to the circuit board.

Figure 19:
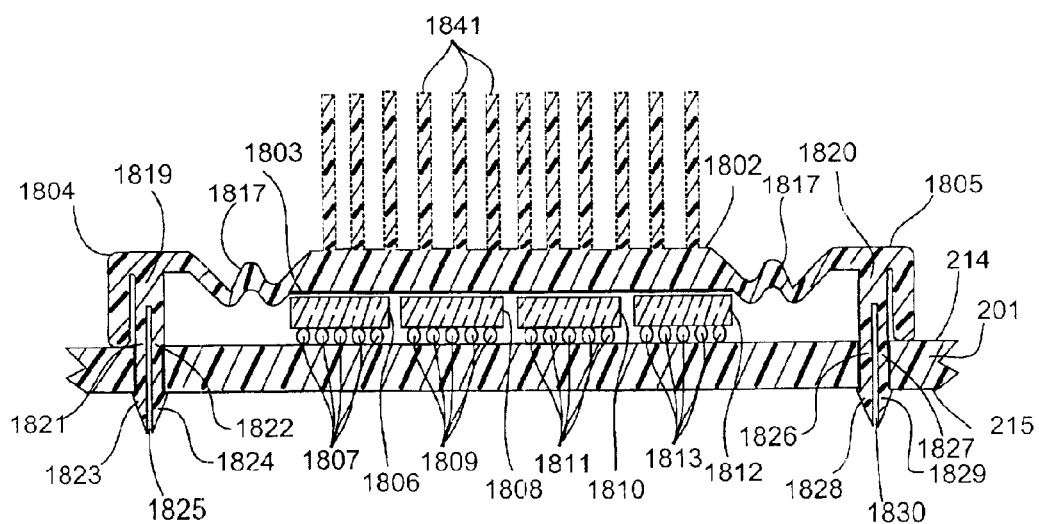
FIG. 19 is a cross sectional view diagram illustrating an assembly comprising an integrated circuit cover in accordance with the example illustrated in FIG. 18.

FIG. 19 is a cross sectional view diagram illustrating an assembly comprising an integrated circuit cover in accordance with the example illustrated in FIG. 18. The assembly comprises circuit board 201 having a first surface 214 and a second surface 215, integrated circuits 1806, 1808, 1810, and 1812, and the integrated circuit cover. Integrated circuit 1806 is attached to the first surface 214 of circuit board 201 via connections 1807. Integrated circuit 1808 is attached to the first surface 214 of circuit board 201 via connections 1809. Integrated circuit 1810 is attached to the first surface 214 of circuit board 201 via connections 1811. Integrated circuit 1812 is attached to the first surface 214 of circuit board 201 via connections 1813.

The integrated circuit cover comprises a plate portion 1802, a spring portion 1817, a spring portion 1818, an attachment portion 1804, and an attachment portion 1805. Plate portion 1802 may optionally include fins 1841 to enhance its thermal characteristics. Optionally, a thermally conductive material 1803 is disposed between integrated circuits 1806, 1808, 1810, and 1812 and plate portion 1802 to provide thermal conductivity from the integrated circuits to the plate portion 1802. When used, the thermally conductive material may be pre-applied or may be applied during assembly. For example, the thermally conductive material may be provided in a tape form and may be applied to the integrated circuit cover or to an area over which the integrated circuit cover is to be mounted. Attachment portion 1804 comprises retainer 1819. Retainer 1819 comprises a first retainer portion 1821 and a second retainer portion 1822. The first retainer portion 1821 includes a first barb 1823. The second retainer portion 1822 includes a second barb 1824. The first retainer portion 1821 and the second retainer portion 1822 define a channel 1825 between them. Attachment portion 1805 comprises retainer 1820. Retainer 1820 comprises a first retainer portion 1826 and a second retainer portion 1827. The first retainer portion 1826 includes a first barb 1828. The second retainer portion 1827 includes a second barb 1829. The first retainer portion 1826 and the second retainer portion 1827 define a channel 1830 between them.

Figure 20:
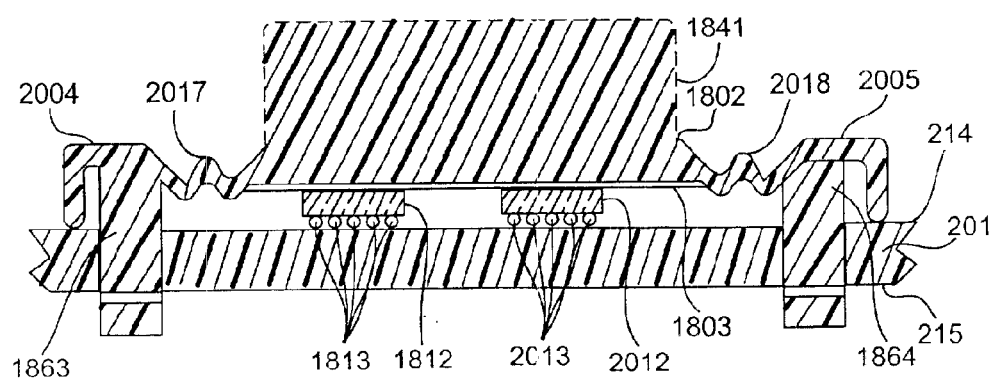
FIG. 20 is a cross sectional view diagram illustrating an assembly comprising an integrated circuit cover in accordance with the example illustrated in FIG. 18.

FIG. 20 is a cross sectional view diagram illustrating an assembly comprising an integrated circuit cover in accordance with the example illustrated in FIG. 18. The assembly comprises circuit board 201 having a first surface 214 and a second surface 215, integrated circuits 1812 and 2012, and the integrated circuit cover. Integrated circuit 1812 is coupled to first surface 214 of circuit board 201 via connections 1813. Integrated circuit 2012 is coupled to first surface 214 of circuit board 201 via connections 2013. A thermally conductive material 1803 is disposed between integrated circuit cover 1802 and integrated circuits 1812 and 2012 to provide thermal conductivity from integrated circuits 1812 and 2012 to integrated circuit cover 1802. The integrated circuit cover comprises a plate portion 1802, a spring portion 2017, a spring portion 2018, an attachment portion 2004, and an attachment portion 2005. The plate portion 1802 may optionally include fins 1841 to enhance its thermal characteristics. Attachment portion 2004 includes retainer 1863 to attach the integrated circuit cover to circuit board 201. Attachment portion 2005 includes retainer 1864 to attach the integrated circuit cover to circuit board 201.

Figure 21:
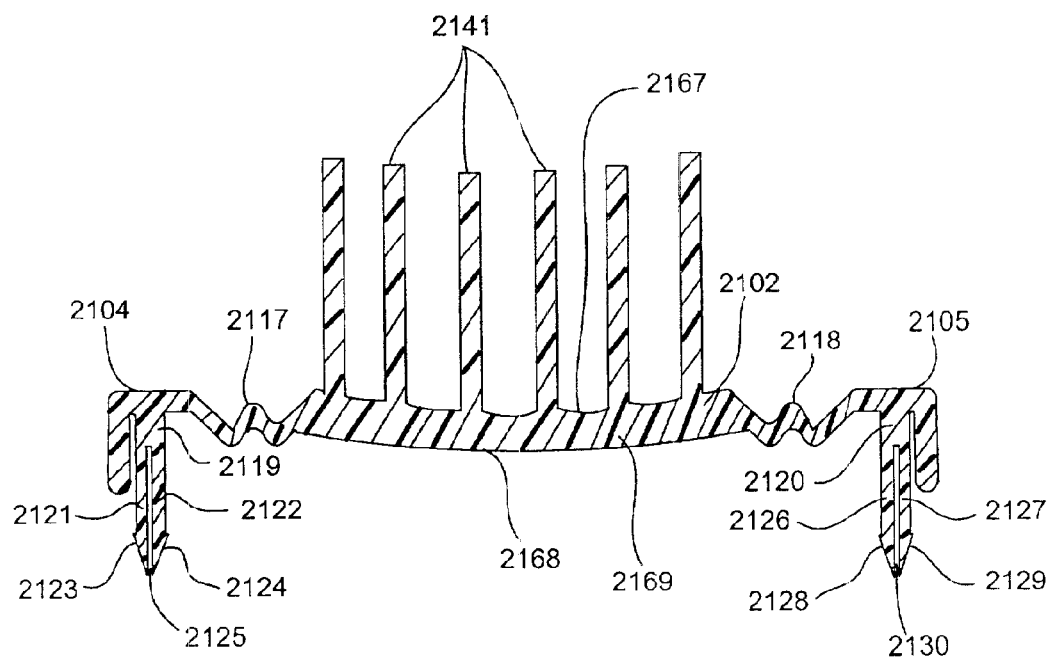
FIG. 21 is a cross sectional view diagram illustrating an integrated circuit cover in accordance with an embodiment of the invention.

FIG. 21 is a cross sectional view diagram illustrating an integrated circuit cover in accordance with an embodiment of the invention. The integrated circuit cover comprises a plate portion 2102, a spring portion 2117, a spring portion 2118, an attachment portion 2104, and an attachment portion 2105. The plate portion 2102 comprises an arcuate portion 2169 having concave surface 2167 and a convex surface 2168. Convex surface 2168 is adapted to be coupled to one or more integrated circuits, preferably by a thermally conductive material. One or more fins 2141 may be coupled to concave surface 2167 of arcuate portion 2169 to enhance thermal performance. Plate portion 2102 is illustrated in a relaxed state. However, when the integrated circuit cover is mounted over integrated circuits, the integrated circuits may apply pressure against convex surface 2168. Plate portion 2102 may be constructed of a deformable material that deforms under the pressure applied by the integrated circuits. Thus, the curvature of arcuate portion 2169 may change when the integrated circuit cover is installed, even to the extent that the arcuate portion 2169 becomes flat or curved in an opposite direction.

Attachment portion 2104 includes retainer 2119. Retainer 2119 comprises a first retainer portion 2121 and a second retainer portion 2122. First retainer portion 2121 includes a first barb 2123. Second retainer portion 2122 includes a second barb 2124. First retainer portion 2121 and second retainer portion 2122 define a channel 2125 that separates them. Attachment portion 2105 includes retainer 2120. Retainer 2120 comprises a first retainer portion 2126 and a second retainer portion 2127. First retainer portion 2126 includes a first barb 2128. Second retainer portion 2127 includes a second barb 2129. First retainer portion 2126 and second retainer portion 2127 define a channel 2130 that separates them.

Figure 22:
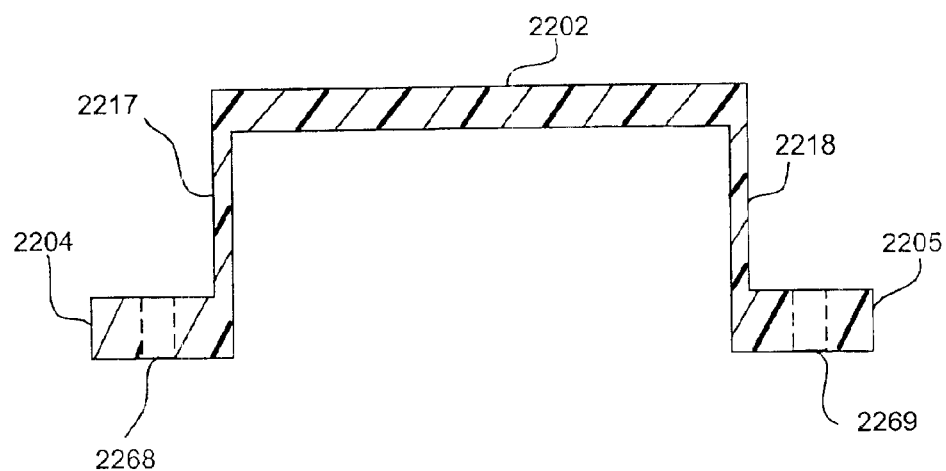
FIG. 22 is a cross sectional view diagram illustrating an integrated circuit cover in accordance with an embodiment of the invention.

FIG. 22 is a cross sectional view diagram illustrating an integrated circuit cover in accordance with an embodiment of the invention. The integrated circuit cover comprises a plate portion 2202, a spring portion 2217, a spring portion 2218, an attachment portion 2204, and an attachment portion 2205. Attachment portion 2204 may include a retainer or may define a hole 2268 to accept a fastener to allow mounting of the integrated circuit cover to a circuit board. Attachment portion 2205 may include a retainer or may define a hole 2269 to accept a fastener to allow mounting of the integrated circuit cover to a circuit board. Spring portion 2217 and spring portion 2218 are constructed of an material exhibiting sufficient elasticity so as to accommodate displacement of plate portion 2202 relative to attachment portion 2204 and attachment portion 2205. Plate portion 2202 may be constructed of a more rigid material, may be thicker to increase its rigidity, and/or may include stiffening members to increase its rigidity.

Figure 23:
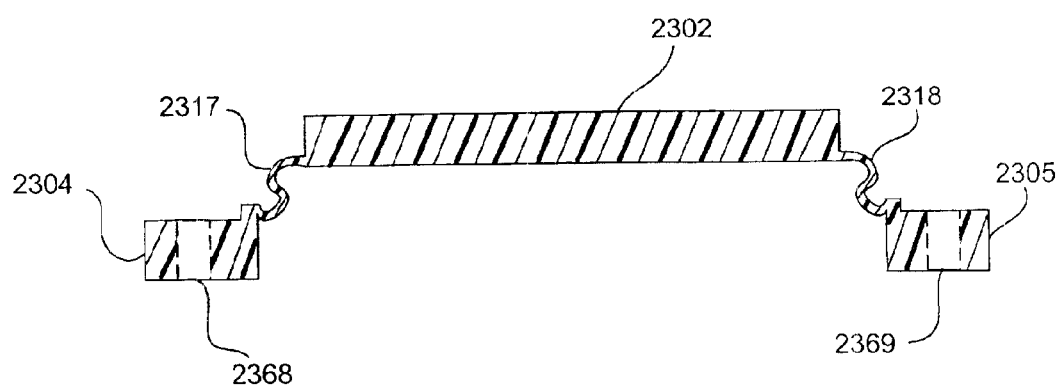
FIG. 23 is a cross sectional view diagram illustrating an integrated circuit cover in accordance with an embodiment of the invention.

FIG. 23 is a cross sectional view diagram illustrating an integrated circuit cover in accordance with an embodiment of the invention. The integrated circuit cover comprises a plate portion 2302, a spring portion 2317, a spring portion 2318, an attachment portion 2304, and an attachment portion 2305. Attachment portion 2304 may include a retainer or may define a hole 2368 to accept a fastener to allow mounting of the integrated circuit cover to a circuit board. Attachment portion 2305 may include a retainer or may define a hold 2369 to accept a fastener to allow mounting of the integrated circuit cover to a circuit board. While other embodiments provide a spring terminus at an attachment portion and a spring terminus at a plate portion that are substantially the same distance from a circuit board, this embodiment provides a spring portion 2317 and spring portion 2318 wherein a spring terminus at an attachment portion and a spring terminus at a plate portion are disposed at different distances from a circuit board to which the integrated circuit cover is attached.

Figure 24:
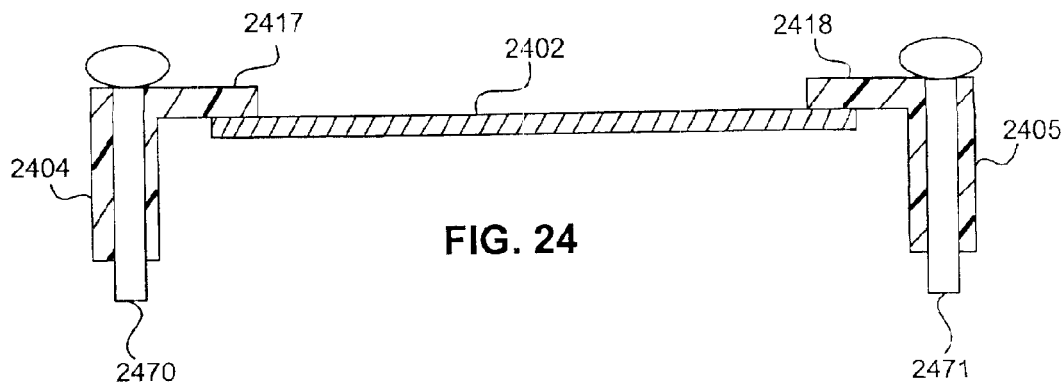
FIG. 24 is a cross sectional view diagram illustrating an integrated circuit cover in accordance with an embodiment of the invention.

FIG. 24 is a cross sectional view diagram illustrating an integrated circuit cover in accordance with an embodiment of the invention. The integrated circuit cover comprises a plate portion 2402 constructed of a more rigid material and attachment portions 2404 and 2405 constructed of a more flexible material. Attachment portion 2404 includes flexible cantilever extension 2417 that retains plate portion 2402 and acts as a spring, flexing as pressure is applied against a surface of plate portion 2402 opposite the surface upon which the flexible cantilever extension 2417 engages. Attachment portion 2405 includes flexible cantilever extension 2418 that retains plate portion 2402 and acts as a spring, flexing as pressure is applied against a surface of plate portion 2402 opposite the surface upon which the flexible cantilever extension 2418 engages. ° Fasteners 2470 and 2471 provide an example of how attachment portions 2404 and 2405, respectively, may be attached to a circuit board.

Figure 25:
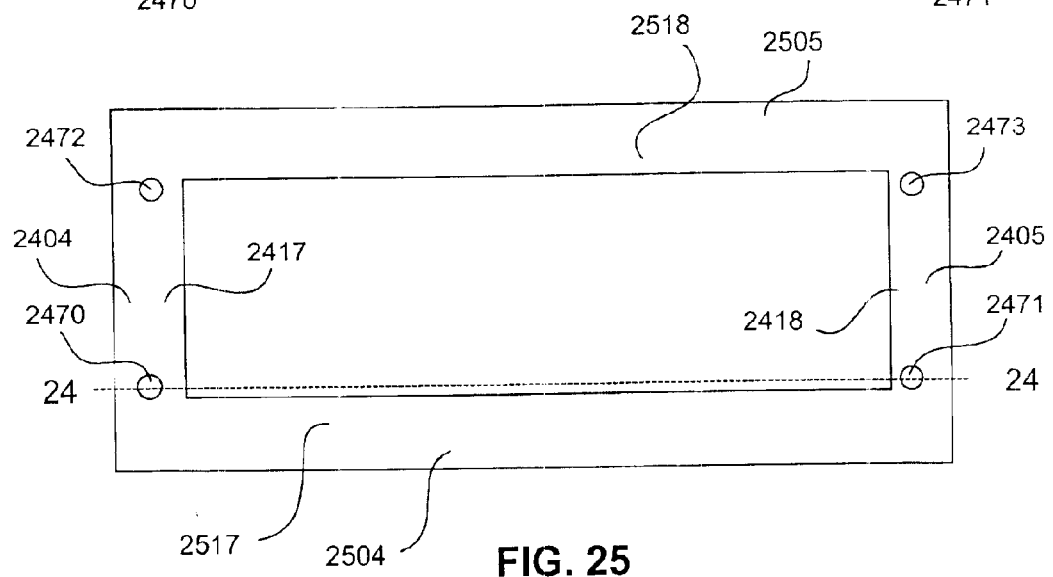
FIG. 25 is a top plan view diagram illustrating an integrated circuit cover in accordance with the example illustrated in FIG. 24.

FIG. 25 is a top plan view diagram illustrating an integrated circuit cover in accordance with the example illustrated in FIG. 24. The integrated circuit cover comprises a plate portion 2402 and attachment portions 2404 and 2405.

Attachment portions 2404 and 2405 may be coupled into a singular attachment portion that surrounds plate portion 2402, for example, by flange portion 2504, which couples attachment portion 2404 to attachment portion 2405 along one side of plate portion 2402, and by flange portion 2505, which couples attachment portion 2404 to attachment portion 2405 along an opposite side of plate portion 2402. Flange portion 2504 includes flexible cantilever extension 2517, which engages plate portion 2402. Flange portion 2505 includes flexible cantilever extension 2518, which engages plate portion 2402.

Attachment portion 2404 includes flexible cantilever portion 2417, which engages plate portion 2402. Attachment portion 2405 includes flexible cantilever portion 2418, which engages plate portion 2402. Attachment portion 2404 may include retainers or may define holes 2470 and 2472 to allow attachment to a circuit board. Attachment portion 2405 may include retainers or may define holes 2471 and 2473 to allow attachment to a circuit board.

Figure 26:
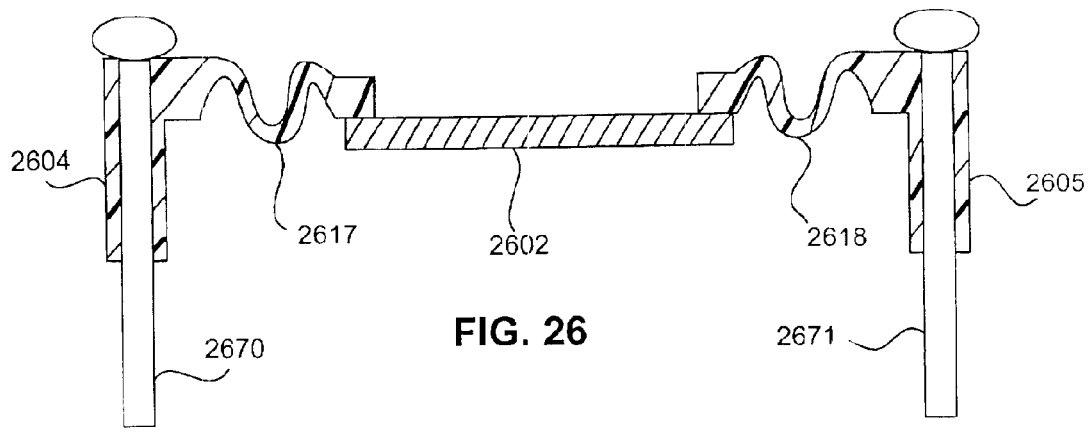
FIG. 26 is a cross sectional view diagram illustrating an embodiment of an integrated circuit cover in accordance with an embodiment of the invention.

FIG. 26 is a cross sectional view diagram illustrating an embodiment of an integrated circuit cover in accordance with an embodiment of the invention. The integrated circuit cover comprises a plate portion 2602, a spring portion 2617, a spring portion 2618, an attachment portion 2604, and an attachment portion 2605. Spring portions 2617 and 2618 engage plate portion 2602. Attachment portion 2604 and spring portion 2617 may be formed as a unitary component, and attachment portion 2605 and spring portion 2618 may be formed as a unitary component, while plate portion 2602 may be formed as a separate component. Attachment portion 2604, spring portion 2617, attachment portion 2605, and spring portion 2618 may be formed as a unitary portion, and plate portion 2602 may be formed as a separate portion. Fasteners 2670 and 2671 provide an example of how attachment portion 2604 and attachment portion 2605, respectively, may be attached to a circuit board.

Figure 27:
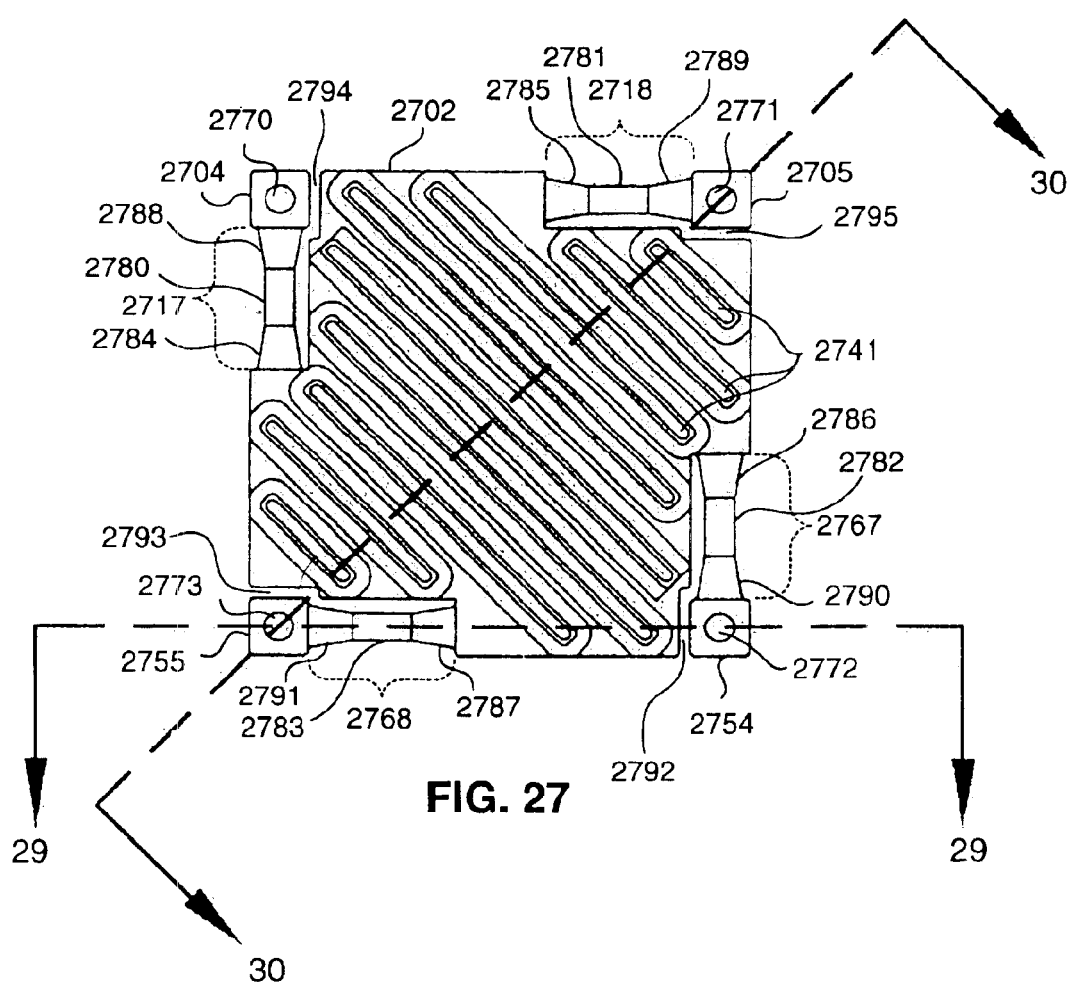
FIG. 27 is a plan view diagram illustrating an embodiment of an integrated circuit cover in accordance with an embodiment of the invention.

FIG. 27 is a plan view diagram illustrating an embodiment of an integrated circuit cover in accordance with an embodiment of the invention. The integrated circuit cover includes a plate portion 2702, attachment portions 2704, 2705, 2754, and 2755, and spring portions 2717, 2718, 2767, and 2768. Spring portions 2717, 2718, 2767, and 2768 couple the plate portion 2702 to the attachment portions 2704, 2705, 2754, and 2755, respectively. The attachment portions 2704, 2705, 2754, and 2755 allow attachment of the integrated circuit cover to a circuit board or other surface. As an example of one technique for allowing attachment, attachment portions 2704, 2705, 2754, and 2755 may define apertures 2770, 2771, 2772, and 2773, respectively, which allow fasteners, such as screws, rivets, or the like to be coupled to attachment portions 2704, 2705, 2754, and 2755. Alternatively, other techniques for allowing attachment, such as those described herein, may be used.

The spring portions 2717, 2718, 2767, and 2768 may be formed in a variety of geometries. For example, the spring portions 2717, 2718, 2767, and 2768 may be of uniform or non-uniform thickness, width, and/or length. In the illustrated example, the spring portion 2717 includes a spring element 2780 of uniform thickness and width coupled to spring elements 2784 and 2788, which are of varying thickness and width and serve to couple spring element 2780 to plate portion 2702 and attachment portion 2704, respectively. The spring portion 2718 includes a spring element 2781 of uniform thickness and width coupled to spring elements 2785 and 2789, which are of varying thickness and width and serve to couple spring element 2781 to plate portion 2702 and attachment portion 2705, respectively. The spring portion 2767 includes a spring element 2782 of uniform thickness and width coupled to spring elements 2786 and 2790, which are of varying thickness and width and serve to couple spring element 2782 to plate portion 2702 and attachment portion 2754, respectively. The spring portion 2768 includes a spring element 2783 of uniform thickness and width coupled to spring elements 2787 and 2791, which are of varying thickness and width and serve to couple spring element 2783 to plate portion 2702 and attachment portion 2755, respectively.

As can be seen from FIG. 27, spring portions 2717, 2718, 2782, and 2783 are, in one example, implemented using cantilever spring elements. These cantilever spring elements are preferably oriented along edges of the plate portion 2702. The cantilever spring elements may be effectively oriented along the edges by orienting the center lines of the spring elements to be non-radial relative to a centroid of the plate portion 2702 (e.g., by orienting the center lines approximately tangentially in relation to the edges). By orienting the spring portions 2717, 2718, 2782, and 2783 in a similar rotational direction about the centroid of the plate portion 2702 (e.g., all oriented clockwise or all oriented counterclockwise), any effective shortening of the length of the spring portions 2717, 2718, 2782, and 2783 projected into a plane of the plan view diagram of FIG. 27 as the spring portions 2717, 2718, 2782, and 2783 are displaced from that plane is accommodated. Thus, in this example, if plate portion 2702 is upwardly displaced, the plate portion 2702 is rotated clockwise as viewed in FIG. 27 relative to attachment portions 2704, 2705, 2754, and 2755. Spring portions 2717, 2718, 2782, and 2783 are configured so as to facilitate such rotation in a mutually cooperative manner, thereby allowing the integrated circuit cover to be more compliant over a greater range of displacement.

One example of configuring spring portions 2717, 2718, 2782, and 2783 such that they will mutually cooperate to allow displacement of plate portion 2702 from a relaxed position can be understood with reference to FIG. 27. As can be seen, spring portion 2717 is oriented so as to define a gap 2790 between attachment portion 2704 and plate portion 2702. The gap 2790 intersects a center line of spring portion 2718. While spring portion 2718 allows some movement of plate portion 2702 in relation to attachment portion 2705 in the vicinity of the edge of plate portion 2702 along which spring portion 2718 lies, gap 2790 allows movement of plate portion 2702 in relation to attachment portion 2704 in the vicinity of the same edge.

Spring portions 2718, 2782, and 2783 are oriented to define gaps 2791, 2792, and 2793, respectively. Gaps 2791, 2792, and 2793 interact with spring portions 2767, 2768, and 2717, respectively, to cooperatively allow displacement of plate portion 2702 from its relaxed position. By selecting the mechanical properties and/or dimensions of spring portions 2717, 2718, 2767, and 2768 to be similar or different, the amount and uniformity of pressure exerted by plate portion 2702 on any dies or other objects over which plate portion 2702 is mounted may be controlled.

To provide enhanced thermal dissipation capacity, a heat sink portion 2741 may be coupled to plate portion 2702. The heat sink portion 2741 may be formed as extended surfaces extending from plate portion 2702. For example, these extended surfaces may include fins, pins, or other structures providing increased surface area The heat sink portion may be formed integrally with the plate portion 2702 or as a separate structure coupled to the plate portion 2702.

Figure 28:
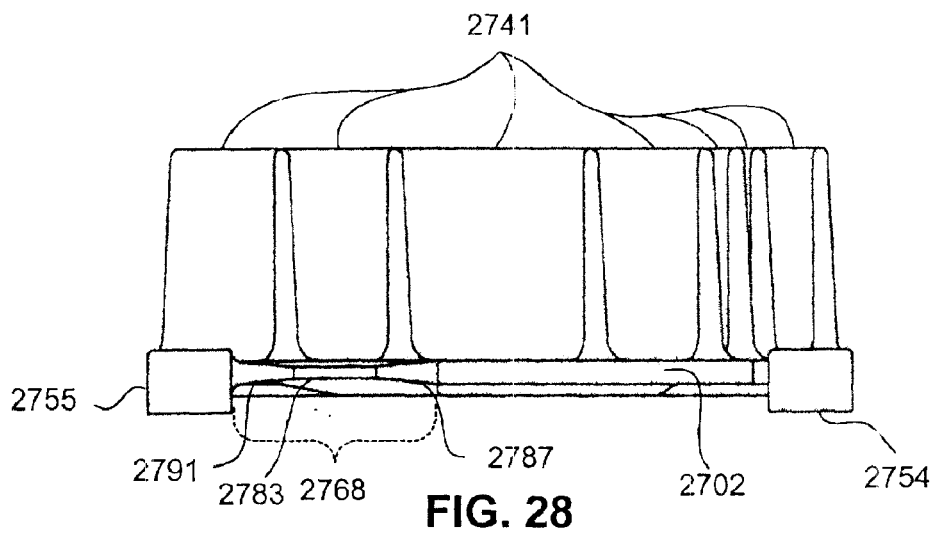
FIG. 28 is an elevation view diagram illustrating the embodiment of the invention shown in FIG. 27.

FIG. 28 is an elevation view diagram illustrating the embodiment of the invention shown in FIG. 27. FIG. 28 illustrates the plate portion 2702, the heat sink portion 2741, the attachment portions 2754 and 2755, and the spring portion 2768. The spring elements 2768, 2787, and 2791 of spring portion 2768 are also illustrated.

Figure 29:
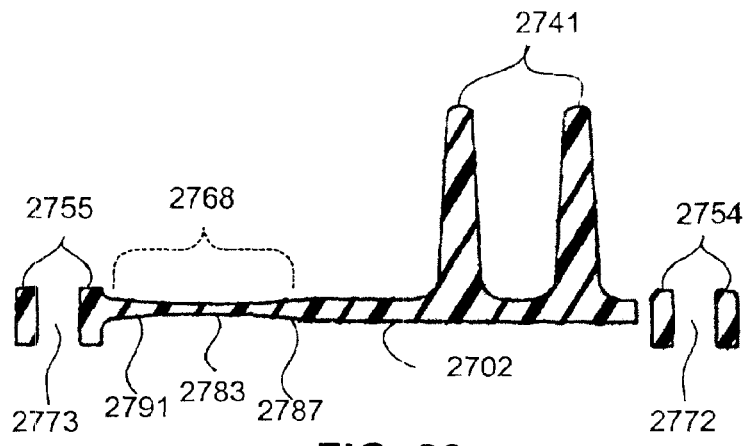
FIG. 29 is a cross-sectional view diagram illustrating the embodiment of the invention shown in FIG. 27.

FIG. 29 is a cross-sectional view diagram illustrating the embodiment of the invention shown in FIG. 27. It should be noted that FIG. 29 depicts only the portion of the integrated circuit cover lying in the plane defined by the corresponding section line shown in FIG. 27. FIG. 29 shows plate portion 2702, attachment portions 2755 and 2754, heat sink portion 2741, and spring portion 2768. Spring elements 2783, 2787, and 2791 of spring portion 2768 are illustrated. Apertures 2772 and 2773 defined by attachment portions 2754 and 2755, respectively, are illustrated.

Figure 30:
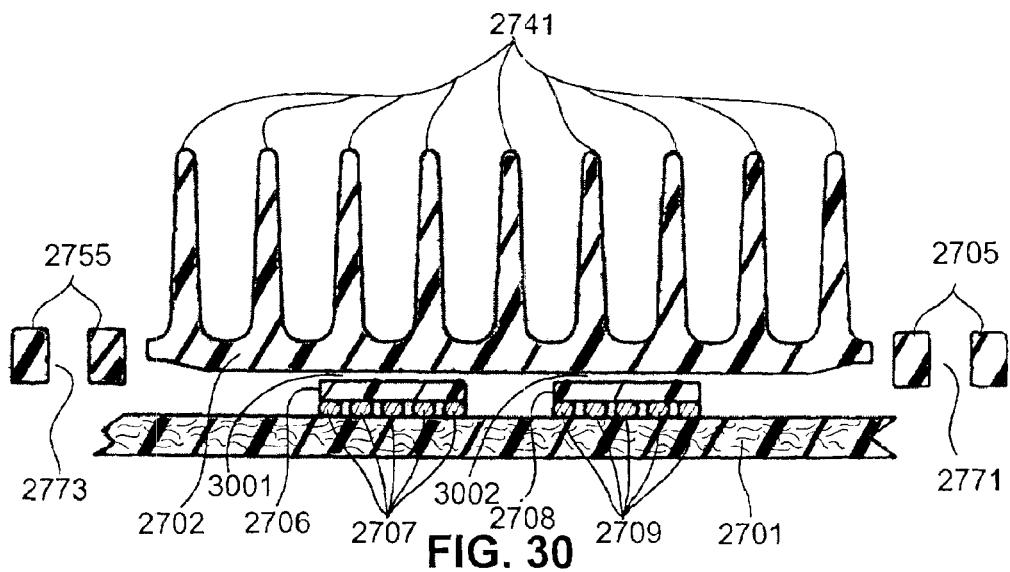
FIG. 30 is a cross-sectional view diagram illustrating the embodiment of the invention shown in FIG. 27 in conjunction with a circuit board and a plurality of dies.

FIG. 30 is a cross-sectional view diagram illustrating the embodiment of the invention shown in FIG. 27 in conjunction with a circuit board and a plurality of dies. It should be noted that FIG. 30 depicts only the portion of the integrated circuit cover, the circuit board, and the plurality of dies lying in the plane defined by the corresponding section line shown in FIG. 27. FIG. 30 shows plate portion 2702, heat sink portion 2741, and attachment portions 2705 and 2755 of the integrated circuit cover. Apertures 2771 and 2773 defined by attachment portions 2705 and 2755, respectively, are illustrated.

The integrated circuit cover of FIG. 30 is illustrated as mounted over dies 2706 and 2708, which are mounted on circuit board 2701 via connections 2707 and 2709, respectively. As one example, a thermal interface or a filler material is disposed in gaps 3001 and 3002 between the plate portion 2702 and the dies 2706 and 2708, respectively. The thermal interface or filler material may have a thermal conductivity suitable for any particular application. For example, when high power dissipation is desired, a more thermally conductive material may be used, while a less thermally conductive material may be used when power dissipation is not as significant. Also, heat sink portion 2741 may be omitted if the additional power dissipation provided by it is not needed. As another example, plate portion 2702 directly contacts dies 2706 and 2708, thereby reducing or eliminating gaps 3001 and 3002. With plate portion 2702 directly in contact with dies 2706 and 2708, filler material need not be used.

Accordingly, a method and apparatus for providing an integrated circuit cover has been described. It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An integrated circuit (IC) cover comprising:
   a plate portion;
   an attachment portion adapted to be directly coupled to a circuit board; and
   a spring portion directly coupled to the plate portion and to the attachment.

2. The IC cover of claim 1 wherein the IC cover is unitarily molded of a polymer material.

3. The IC cover of claim 2 wherein the polymer material has a thermal conductivity of at least 10 watts/meter Kelvin.

4. The IC cover of claim 2 further comprising:
   a heat sink portion coupled to the plate portion.

5. The IC cover of claim 4 wherein the heat sink portion includes extended surfaces.

6. The IC cover of claim 5 wherein the extended surfaces include fins.

7. The IC cover of claim 1 wherein the attachment portion comprises:
   a retainer having a first retainer portion and a second retainer portion, the retainer defining a channel between the first retainer portion and the second retainer portion, the first retainer portion terminating in a first barb and the second retainer portion terminating in a second barb.

8. The IC cover of claim 1 wherein the spring portion has a cross section comprising a V-shaped portion.

9. The IC cover of claim 8 wherein the spring portion has a cross section comprising a zig-zag-shaped portion.

10. The IC cover of claim 1 wherein the spring portion has a cross section comprising a U-shaped portion.

11. The IC cover of claim 1 wherein the spring portion has a cross section comprising an arcuate portion.

12. The IC cover of claim 11 wherein the spring portion has a cross section comprising an S-shaped portion.

13. The IC cover of claim 1 wherein the spring portion has a cross section comprising a molded living hinge portion.

14. The IC cover of claim 1 wherein the spring portion has a cross section comprising a molded cantilever hinge portion.

15. The IC cover of claim 1 wherein the spring portion is disposed at an end of the plate portion.

16. The IC cover of claim 1 wherein the spring portion includes a plurality of individual spring elements, wherein a first one of the plurality of individual spring elements is disposed at a first end of the plate portion and a second one of the plurality of individual spring elements is disposed at a second end of the plate portion.

17. The IC cover of claim 16 wherein the plurality of individual spring elements ate disposed around a perimeter of the plate portion.

18. The IC cover of claim 16 wherein at least one of the individual spring elements is maintained in a non-relaxed state.

19. The IC cover of claim 1 wherein the spring portion is disposed around the perimeter of the plate portion.

20. The IC cover of claim 1 wherein the spring portion forms a closed path around the perimeter of the plate portion.

21. The IC cover of claim 1 wherein the spring portion comprises a uniform diaphragm spring.

22. The IC cover of claim 1 further comprising:
   a heat sink portion coupled to the plate portion.

23. The IC cover of claim 22 wherein the heat sink portion includes extended surfaces.

24. The IC cover of claim 23 wherein the extended surfaces include fins.

25. The IC cover of claim 1 wherein the plate portion and the spring portion are unitarily formed of a metal material.

26. The IC cover of claim 1 wherein the attachment portion and the spring portion are unitarily molded of a polymer material.

27. The IC cover of claim 1 wherein the plate portion is formed to have an arcuate cross section so as to substantially equalize pressure exerted against a convex surface of the plate portion.

28. An integrated circuit (IC) cover comprising:
   an attachment portion adapted to be directly coupled to a circuit board, wherein at least one die is coupled to the circuit board;

a plate portion of flexible material coupled to the attachment portion, wherein the plate portion is formed so as to exert pressure to the at least one die when the attachment portion is coupled to the circuit board; and a spring portion coupling the attachment portion to the plate portion.

29. The IC cover of claim 28 wherein the plate portion is formed so as to exert pressure to the at least one die in a direction toward the circuit board.

30. An integrated circuit (IC) assembly comprising:

a circuit board;

at least one first die disposed on a first surface of the circuit board; and a cover including:
   a plate portion disposed so as to cover the at least one first die;
   an attachment portion adapted to be directly coupled to the circuit board; and
   a spring portion directly coupled to the plate portion and to the attachment portion.

31. The IC assembly of claim 30 wherein the spring portion exerts pressure between the plate portion and the at least one first die.

32. The IC assembly of claim 31 wherein, when the attachment portion is coupled to the circuit board, the spring portion is in a non-relaxed state.

33. The IC assembly of claim 30 further comprising:

at least one second die disposed on a second surface of the circuit board.

34. The IC assembly of claim 33 further comprising:

a second cover attached to the circuit board, the second cover covering the at least one second die.

35. An integrated circuit (IC) cover comprising:

a plate portion having a plurality of edges;

a plurality of attachment portions adapted to be directly coupled to a circuit board; and a plurality of spring portions directly coupled to the plate portion and to the plurality of attachment portions, wherein each of the spring portions is oriented along a direction of a corresponding one of the plurality of edges.

36. The IC cover of claim 35 wherein center lines of the plurality of spring portions are oriented so as to be non-radial relative to a centroid of the plate portion.

37. The IC cover of claim 35 wherein each of center lines of the plurality of spring portions are oriented approximately tangentially in relation to a corresponding one of the plurality of edges.

38. The IC cover of claim 35 wherein the plurality of spring portions are oriented in a similar rotational direction with respect to a centroid of the plate portion.

39. The IC cover of claim 35 wherein the plurality of spring portions are configured to cooperatively accommodate displacement of the plate portion from a relaxed position.

40. The IC cover of claim 35 wherein at least one of the plurality of spring portions is maintained in a non-relaxed state when at least one of the plurality of attachment portions is coupled to & the circuit board such that the plate portion overlies at least one IC.

41. An integrated circuit (IC) cover comprising:

a plate portion;

an attachment portion disposed around at least a portion of a periphery of the plate portion; and a spring portion coupled between the plate portion and the attachment portion.

42. An integrated circuit (IC) cover comprising:

an attachment portion adapted to be coupled to a circuit board, wherein a die is coupled to the circuit board; and a plate portion of flexible material disposed substantially internal to the attachment portion and coupled thereto, wherein the plate portion is formed so as to exert pressure to the die when the attachment portion is coupled to the circuit board; and a spring portion coupling the attachment portion to the plate portion.

43. An integrated circuit (IC) assembly comprising:

a circuit board;

a die disposed on a first surface of the circuit board; and a cover including:
   a plate portion disposed so as to cover the die;
   an attachment portion disposed around at least a portion of a periphery of the plate portion; and
   a spring portion coupled between the plate portion and the attachment.

44. An integrated circuit (IC) cover comprising:

a plate portion having a plurality of edges;

a plurality of attachment portions disposed around at least a portion of the edges of the plate portion; and a plurality of spring portions coupled between the plate portion and the plurality of attachment portions, wherein each of the spring portions is oriented along a direction of a corresponding one of the plurality of edges.

\* \* \* \* \*